US012706128B2

(12) United States Patent
Kim et al.

(10) Patent No.: US 12,706,128 B2
(45) Date of Patent: Aug. 11, 2026

(54) COMPUTE-IN-MEMORY WITH CURRENT TRANSITION DETECTION

(71) Applicant: QUALCOMM Incorporated, San Diego, CA (US)

(72) Inventors: Seohee Kim, San Diego, CA (US); Chulmin Jung, San Diego, CA (US); Dimple Vijay Kochar, Cambridge, MA (US)

(73) Assignee: QUALCOMM Incorporated, San Diego, CA (US)

( * ) Notice: Subject to any disclaimer, the term of this patent is extended or adjusted under 35 U.S.C. 154(b) by 127 days.

(21) Appl. No.: 18/403,010

(22) Filed: Jan. 3, 2024

(65) Prior Publication Data

US 2025/0218475 A1 Jul. 3, 2025

(51) Int. Cl.
*G06F 7/50* (2006.01)
*G06F 7/523* (2006.01)
*G11C 7/10* (2006.01)
*G11C 11/412* (2006.01)
*G11C 11/419* (2006.01)

(52) U.S. Cl.
CPC .............. *G11C 7/1006* (2013.01); *G06F 7/50* (2013.01); *G06F 7/523* (2013.01); *G11C 11/412* (2013.01); *G11C 11/419* (2013.01)

(58) Field of Classification Search
CPC ... G11C 7/1006; G11C 11/412; G11C 11/419; G11C 11/54; G06F 7/50; G06F 7/523
See application file for complete search history.

(56) References Cited

U.S. PATENT DOCUMENTS

| | | | | |
|---|---|---|---|---|
| 8,929,153 B1 * | 1/2015 | Gulati | G11C 11/412 | 365/189.02 |
| 9,490,008 B1 * | 11/2016 | Moharir | G11C 11/419 | |
| 2018/0277177 A1 * | 9/2018 | Takaya | G11C 7/1051 | |
| 2021/0073650 A1 * | 3/2021 | Reisser | G06F 17/16 | |
| 2021/0192325 A1 * | 6/2021 | Hoang | G11C 13/0069 | |
| 2022/0223197 A1 * | 7/2022 | Xue | G11C 11/4094 | |
| 2022/0238151 A1 * | 7/2022 | Lin | G06F 7/501 | |
| 2023/0066113 A1 * | 3/2023 | Chen | G11C 11/418 | |
| 2023/0073272 A1 * | 3/2023 | Okajima | G06N 3/063 | |
| 2023/0115373 A1 * | 4/2023 | Badaroglu | G06N 3/0464 | 708/670 |

FOREIGN PATENT DOCUMENTS

| | | |
|---|---|---|
| WO | 2021178585 A1 | 9/2021 |
| WO | 2023015167 A1 | 2/2023 |

OTHER PUBLICATIONS

International Search Report and Written Opinion—PCT/US2024/062332—ISA/EPO—Feb. 28, 2025.

* cited by examiner

*Primary Examiner* — Khamdan N. Alrobaie
(74) *Attorney, Agent, or Firm* — Loza & Loza LLP

(57) ABSTRACT

A compute-in-memory system is provided in which a plurality of compute-in-memory bitcells couple to a read bit line. Depending upon sequential binary multiplications in the compute-in-memory bitcells, a current from the read bit line sequentially increases. A transition detection circuit detects and counts the current transitions to provide a multiply-and-accumulate result from the sequential binary multiplications.

20 Claims, 6 Drawing Sheets

COMPUTE-IN-MEMORY WITH CURRENT TRANSITION DETECTION

TECHNICAL FIELD

This application relates to compute-in-memories, and more particularly to a compute-in-memory with current transition detection.

BACKGROUND

Computer processing of data typically uses a Von Neumann architecture in which the data is retrieved from a memory to be processed in an arithmetic and logic unit. In computation-intensive applications such as machine learning, the data flow from and to the memory becomes a bottleneck for processing speed. To address this data-movement bottleneck, compute-in-memory architectures have been developed in which the data processing hardware is distributed across the bitcells.

SUMMARY

In accordance with an aspect of the disclosure, a compute-in-memory multiply-and-accumulate circuit is provided that includes: a read bit line; a plurality of read word lines; a plurality of compute-in-memory bitcells corresponding to the plurality of read word lines, wherein each compute-in-memory bitcell includes a first transistor coupled to the read bit line and having a gate coupled to the corresponding read word line; and a read word line driver configured to receive a plurality of activation bits corresponding to the plurality of read word lines, the read word line driver being further configured to sequentially charge each read word line for which the corresponding activation bit equals a first binary value.

In accordance with another aspect of the disclosure, a compute-in-memory method is provided that includes: determining whether each activation bit from a plurality of activation bits corresponding to a plurality of compute-in-memory bitcells equals a first binary value, wherein each compute-in-memory bitcell couples to a corresponding read word line from a plurality of read word lines; sequentially charging each of the read word lines coupled to a compute-in-memory bitcell for which the corresponding activation bit is determined to equal the first binary value; and sequentially incrementing a current from a read bit line for each of the compute-in-memory bitcells in which the compute-in-memory bitcell both stores a filter weight bit equaling the first binary value and couples to a charged one of the read word lines.

Finally, in accordance with yet another aspect of the disclosure, a compute-in-memory system is provided that includes: a plurality of compute-in-memory bitcells coupled to a read bit line; and a current transition detection circuit configured to detect and count transitions in a current from the read bit line to provide a multiply-and-accumulate result.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figure.

DETAILED DESCRIPTION

In deep learning and other machine learning applications, a convolutional layer in a neural network is a fundamental building block. A convolutional layer includes a collection of nodes for the multiplication of filter weights with an input vector of activation bits from a previous layer (or from input data such as an image being analyzed). The use of neural networks in machine learning applications thus results in a large number of multiply-and-accumulate (MAC) operations at the various convolutional layers. To increase the processing speed, the MAC operations are implemented using compute-in-memory bitcells. A compute-in-memory bitcell as disclosed herein not only stores a filter weight but functions as a logic gate to perform the multiplication of the stored binary filter weight with the corresponding input bit.

Figure 1:
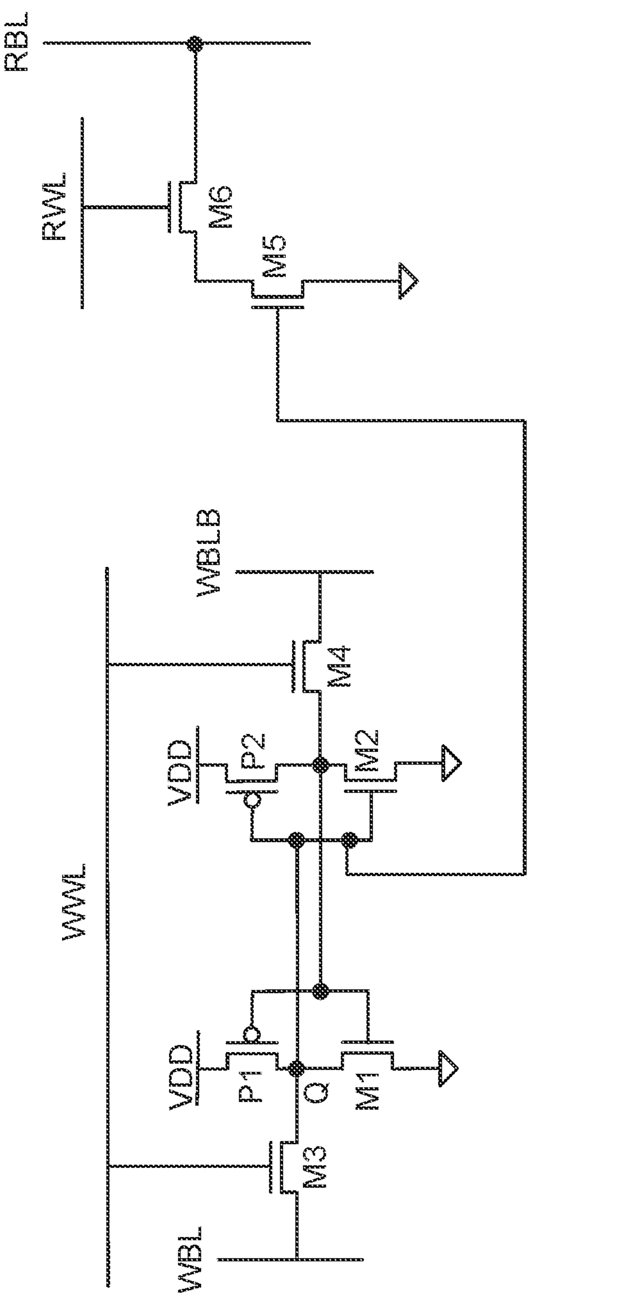
FIG. 1 illustrates an eight-transistor compute-in-memory bitcell in accordance with an aspect of the disclosure.
Figure 1:
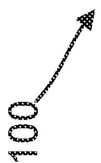

An example compute-in-memory (CiM) bitcell 100 is shown in FIG. 1. Bitcell 100 stores a filter weight bit using a pair of cross-coupled inverters. A first inverter in the pair of cross-coupled inverters is formed by a serial stack of a p-type metal-oxide semiconductor (PMOS) transistor P1 and an n-type metal-oxide semiconductor (NMOS) transistor M1. Similarly, a second inverter is formed by a serial stack of a PMOS transistor P2 and an NMOS transistor M2. The sources of transistors P1 and P2 couple to a power supply node for a memory power supply voltage VDD whereas the drains of transistors M1 and M2 couple to ground. The drains of transistors P1 and M1 form a true output node Q (a bit node) for the stored filter weight. Similarly, the drains of transistor P2 and M2 form a complement output node QB (a complement bit node) for a complement of the stored filter weight. An NMOS first access transistor M3 couples between the Q output node and a write bit line WBL. Similarly, an NMOS second access transistor M4 couples between the QB output node and a complement write bit line WBLB. A write word line WWL couples to the gates of the access transistors M3 and M4. When the write word line voltage is asserted during a write operation, access transistor M3 switches on to couple the Q output node to the write bit line. Similarly, access transistor M4 also switches on to couple the QB output node to the complement write bit line. Depending upon the binary states of the write bit line and the complement write bit line, a filter weight bit may then be written into CiM bitcell 100.

With CiM bitcell 100 storing a filter weight bit (either a binary one or a binary zero), a compute-in-memory operation may now occur. In that regard, the Q output node couples to a gate of an NMOS transistor M5 having a source coupled to coupled to ground and a drain coupled to a source of an NMOS transistor M6 having a drain coupled to a read bit line RBL. A read word line RWL couples to the gate of transistor M6. During the compute-in-memory operation, an incoming activation bit (not illustrated) determines whether a voltage of the read word line is charged to the memory power supply voltage VDD. Should the activation bit be a binary one (in an active high implementation), the read word line is charged to the memory power supply voltage VDD during the compute-in-memory operation to switch on transistor M6. But if the activation bit is a binary zero, the read word line remains grounded during the compute-in-memory operation to maintain transistor M6 off. The binary state of the filter weight bit stored in the CiM bitcell 100 determines whether transistor M5 is also switched on during the compute-in-memory operation. Transistor M6 is also denoted herein as a first transistor whereas transistor M5 is also denoted as a second transistor herein. In an active-high implementation, transistors M5 and M6 are both switched on during the compute-in-memory operation only when both the activation bit and the filter weight bit are binary ones. Prior to the compute-in-memory operation, the read bit line is pre-charged to the memory power supply voltage VDD. Thus, the read bit line will discharge a read bit line current through transistors M5 and M6 into ground only when both the activation bit and the filter weight bit are binary ones, which lowers the read bit line voltage accordingly. Since this discharge occurs only when both the activation bit and the filter weight bit are binary ones, it may be seen that CiM bitcell 100 functions as a NAND gate binary multiplier using the eight transistors M1, M2, M3, M4, M5, M6, P1, and P2.

Figure 2:
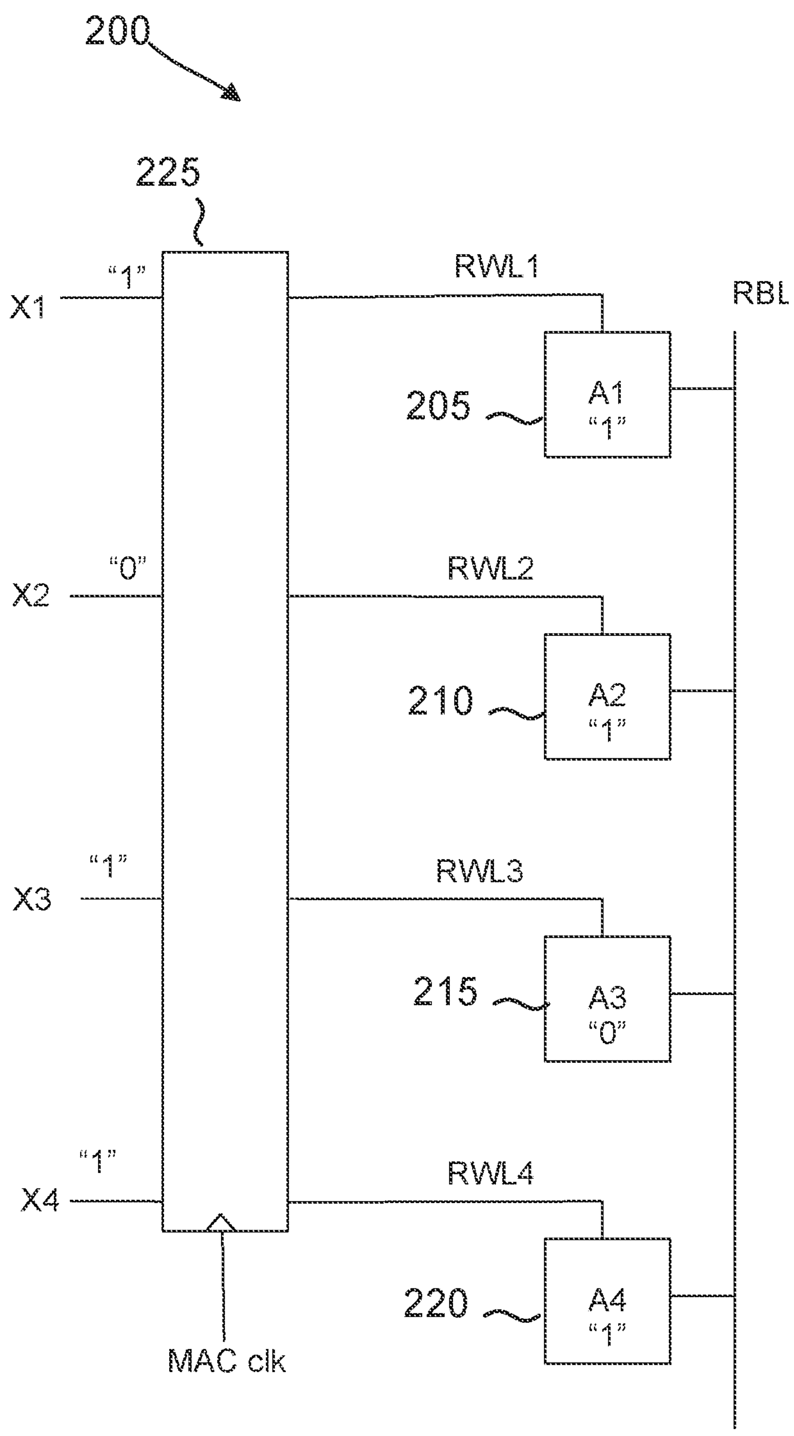
FIG. 2 illustrates a multiply-and-accumulate (MAC) circuit including a plurality of compute-in-memory bitcells in accordance with an aspect of the disclosure.

The calculation of a node value in a neural network generally requires a multiply-and-accumulate operation involving the multiplication of multiple activation bits and corresponding filter weight bits. A collection of CiM bitcells to form a multiply-and-accumulate (MAC) circuit 200 is shown in FIG. 2. A CiM bitcell 205 stores a filter weight bit A1. Similarly, a CiM bitcell 210 stores a filter weight bit A2. In the same fashion, a CiM bitcell 215 stores a filter weight bit A3. Finally, a CiM bitcell 220 stores a filter weight bit A4. Each CiM bitcell 205 through 220 in MAC circuit 200 may be formed as discussed for CiM bitcell 100. An activation bit X1 controls whether a read word line RWL1 switches on transistor M6 (illustrated only in CiM bitcell 100) in CiM bitcell A1. Similarly, an activation bit X2 controls whether a read word line RWL2 switches on the transistor M6 in CiM bitcell A2. In the same fashion, an activation bit X3 controls whether a read word line RWL3 switches the transistor M6 in CiM bitcell A3. Finally, an activation bit X4 controls whether a read word line RWL4 switches on the transistor M6 in CiM bitcell A4. A read bit line RBL couples to the drain of these transistors analogously as shown for the coupling to the transistor M6 of CiM bitcell 100. During a compute-in-memory operation, a read bit line current conducted by the read bit line will thus represent a MAC result equaling X1*A1+X2*A2+X3*A3+X4*A4. More generally, the number of CiM bitcells in MAC circuit 200 depends upon the number of activation bits and corresponding filter weight bits that are multiplied and summed for a given node in a neural network.

To determine the result of the compute-in-memory MAC operation for MAC circuit 200, an analog-to-digital converter (ADC) (not illustrated) would traditionally map the read bit line current to a corresponding MAC result. But MAC circuit 200 is subject to process variations that in turn affect the magnitude of the read bit line current conducted during a compute-in-memory MAC operation. Depending upon the process node, a MAC result may be erroneously interpreted. To reduce the error, a machine-learning classifier (not illustrated) may process the ADC output based upon a reference generator output that tracks that process variation. The ADC and the machine-learning classifier both consume integrated circuit die space and thus increase costs. Despite this added cost, the process variation prevents 100% accuracy for the compute-in-memory MAC computation.

Figure 3:
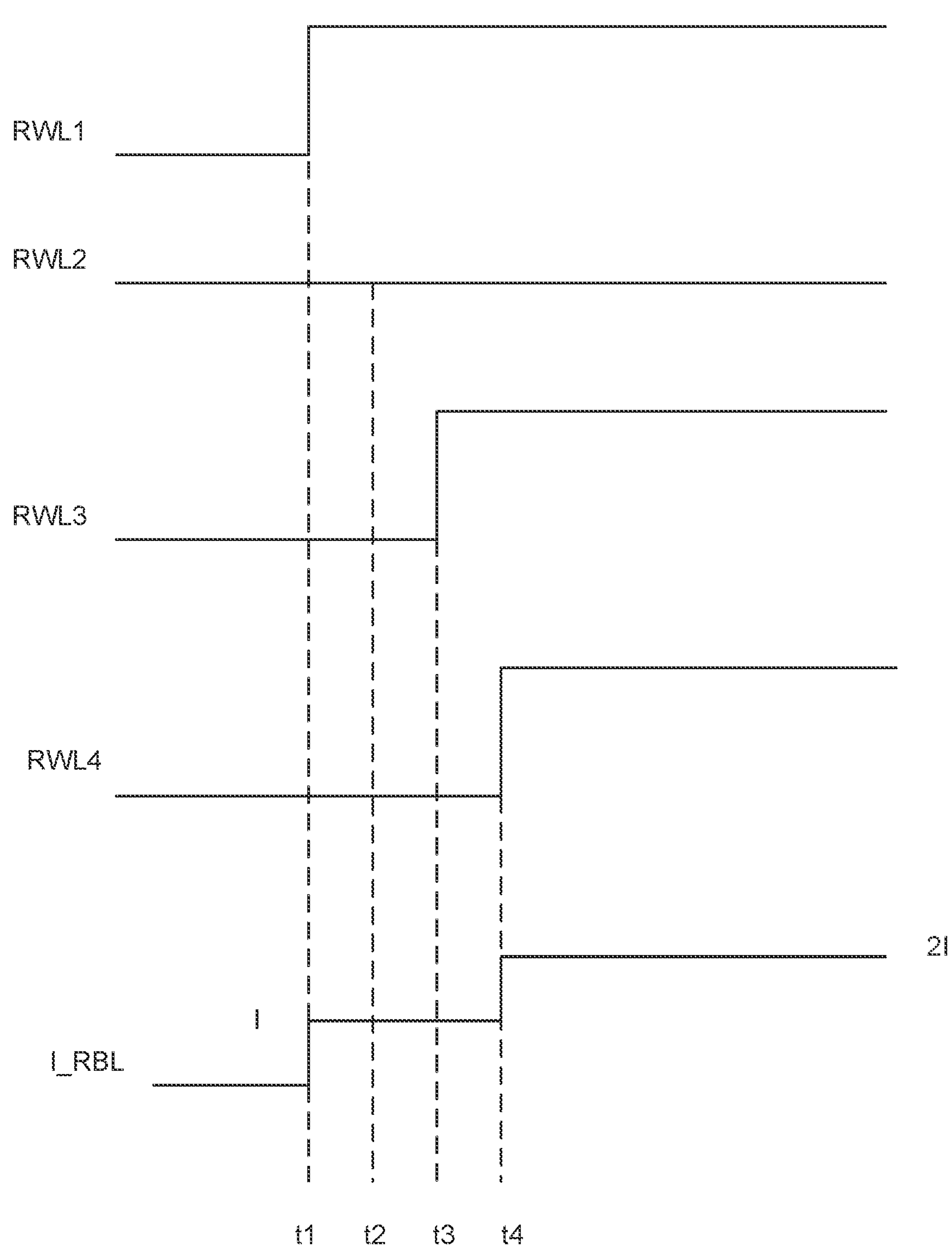
FIG. 3 illustrates some example operating waveforms for the MAC circuit of FIG. 2 in accordance with an aspect of the disclosure.

Rather than computing the magnitude of the read bit line current and thus facing the costs of the ADC and the machine-learning classifier, a compute-in-memory MAC computation is provided herein in which current transitions are counted. As part of this current transition approach, the excitation of the read word lines in MAC circuit 200 are sequenced by a read word line driver 225 responsive to cycle of a MAC clock signal that cycles multiple times for each CiM MAC operation. Some example operating waveforms for the MAC circuit 200 are shown in FIG. 3. With regard to these waveforms, it is assumed that the filter weight bit stored by each of the CiM bitcells 205, 215, and 220 is a binary one and that the filter weight bit stored by the CiM bitcell 210 is a binary zero as shown in FIG. 2. In addition, it is assumed that the activation bits X1, X3, and X4 are all binary ones and that the activation bit X2 is a binary zero as further shown in FIG. 2. During the CiM MAC operation, the read word line driver 225 serially addresses the read word lines responsive to cycles of the MAC clock signal while determining whether the corresponding activation bits equal a first binary value (e.g., a binary one value). A first cycle occurs at a time t1 during which the first read word line RWL1 is addressed. The term "addressed" is being used because whether the read word line driver 225 actually drives the corresponding read word line depends upon the corresponding activation bit. Since the read word line driver 225 determines that the activation bit X1 is a binary one, the read word line driver 225 charges the first read word line RWL1 to the memory power supply voltage VDD at time t1. Because the CIM bitcell 205 is storing a binary one, the assertion of the read word line RWL at time t1 causes a read bit line current (I_RBL) for the read bit line to transition from zero to a current I at time t1. This current I conducts from the switching on of transistors M5 and M6 (FIG. 1) in CIM bitcell 205.

A second cycle occurs at a time t2. However, since the activation bit X2 is a binary zero, the read word line driver 225 does not assert the second read word line RWL2 at time t2. The second read word line RWL2 thus remains discharged at time t2. Although the CiM bitcell 210 is storing a binary one, the read bit line current I_RBL does not change at time t2 since the equivalent of transistor M6 in CiM bitcell 210 will remain off at time t2. A third cycle occurs at a time t3. Because the activation bit X3 is a binary one, the read word line driver 225 asserts the third read word line RWL3 at time t3. But the CIM bitcell 215 is storing a binary zero and thus there is no change to the read bit line current I_RBL at time t3. Finally, a fourth cycle occurs at a time t4. In response to the activation bit X4 being a binary one, the read word line driver 225 asserts the fourth read word line RWL4 at time t4. Because the activation bit X4 is a binary one and the fourth read word line RWL4 is asserted, the CIM bitcell 220 conducts a current I to ground from the read bit line. The read bit line current I_RBL thus increases from I to 2I at time t4.

Figure 4:
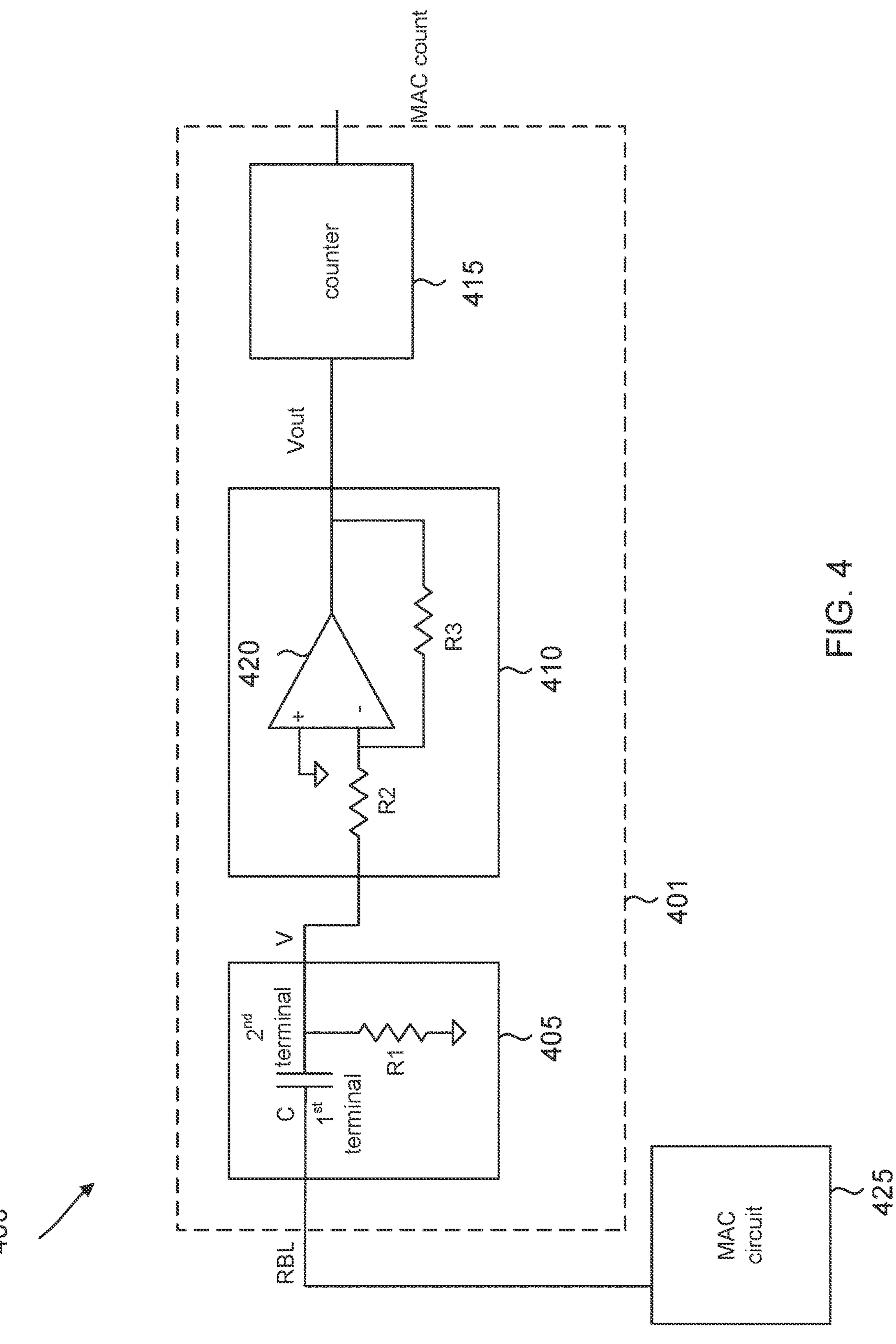
FIG. 4 illustrates an example compute-in-memory system including a current transition detection circuit in accordance with an aspect of the disclosure.

Note the advantages of the resulting CiM MAC operation. Rather than the traditional switching on the read word lines simultaneously and then converting the read bit line current magnitude into a MAC result, the MAC result from MAC circuit 200 can be determined by instead counting the current transitions in the read bit line current I_RBL. The resulting counting is significantly more robust to process variations than converting the read bit line current magnitude into a MAC result. Moreover, a current transition detection circuit that detects and counts the transitions in the read bit line current I_RBL is markedly more compact as compared to the use of an ADC and a machine-learning classifier. An example compute-in-memory system 400 including a current transition detection circuit 401 is shown in FIG. 4. The read bit line couples to a first terminal of a capacitor C of a differentiator 405. A second terminal of the capacitor C couples to ground through a resistor R1. Capacitor C and resistor R1 thus form a high-pass filter that high-pass filters the read bit line voltage. As known in the high-pass filter arts, if a time constant t of a high-pass filter is sufficiently small compared to a period of the signal being filtered the high-pass filter functions as a differentiator. While the read bit line current is not transitioning (e.g., at time t3 of FIG. 3), the read bit line voltage is effectively a direct current (DC) voltage that is blocked by the capacitor C. At such times, a differentiator voltage V at the second terminal of the capacitor C is grounded due to conduction through the resistor R1. But consider a current transition time such as time t1 or time t4 of FIG. 3. The read bit line voltage drops at the current transition time and thus lowers the voltage of the first terminal of the capacitor C. But prior to this voltage lowering, the first terminal is charged with respect to the discharged second terminal voltage. The lowering of the first terminal voltage thus causes the second terminal of the capacitor C to be lowered to a negative voltage. This sudden negative charging of the differentiator voltage V is then discharged back to ground through resistor R1 until the next current transition, whereupon the negative pulsing of the differentiator voltage V is repeated.

An inverting amplifier 410 amplifies and inverts the negative pulsing of the differentiator voltage V into a positively-pulsed amplifier output voltage Vout. It will be appreciated that amplifier 410 may instead be a non-inverting amplifier in alternative implementations. Amplifier 410 includes a resistor R2 that receives the differentiator voltage V and couples to an inverting input terminal of an operational amplifier 420. A non-inverting input terminal of the operational amplifier 420 couples to ground. Finally, a resistor R3 couples between the inverting input terminal of the operational amplifier 420 and an output terminal of the operational amplifier 420 that carries the output voltage Vout. A ratio of the resistances for the resistors R3 and R2 determines a gain of the inverting amplifier 410. In some implementations, a relatively high gain may be used for the inverting amplifier 410 in that the negative pulsing of the differentiator voltage V may be in the millivoltage range or even smaller. In contrast, the pulsing high of the amplifier output voltage Vout may be from ground to the power supply voltage VDD. This relatively large magnitude of the pulsing of the amplifier output voltage Vout aids the operation of a counter 415 that couples to the output terminal of the operational amplifier 420 to count the positive pulses of the amplifier output voltage Vout. In some implementations, counter 415 may be a flip-flop-based counter. The counter 415 counts the pulses of the amplifier output voltage Vout to form a MAC count that equals the result of the CIM MAC operation.

Figure 5:
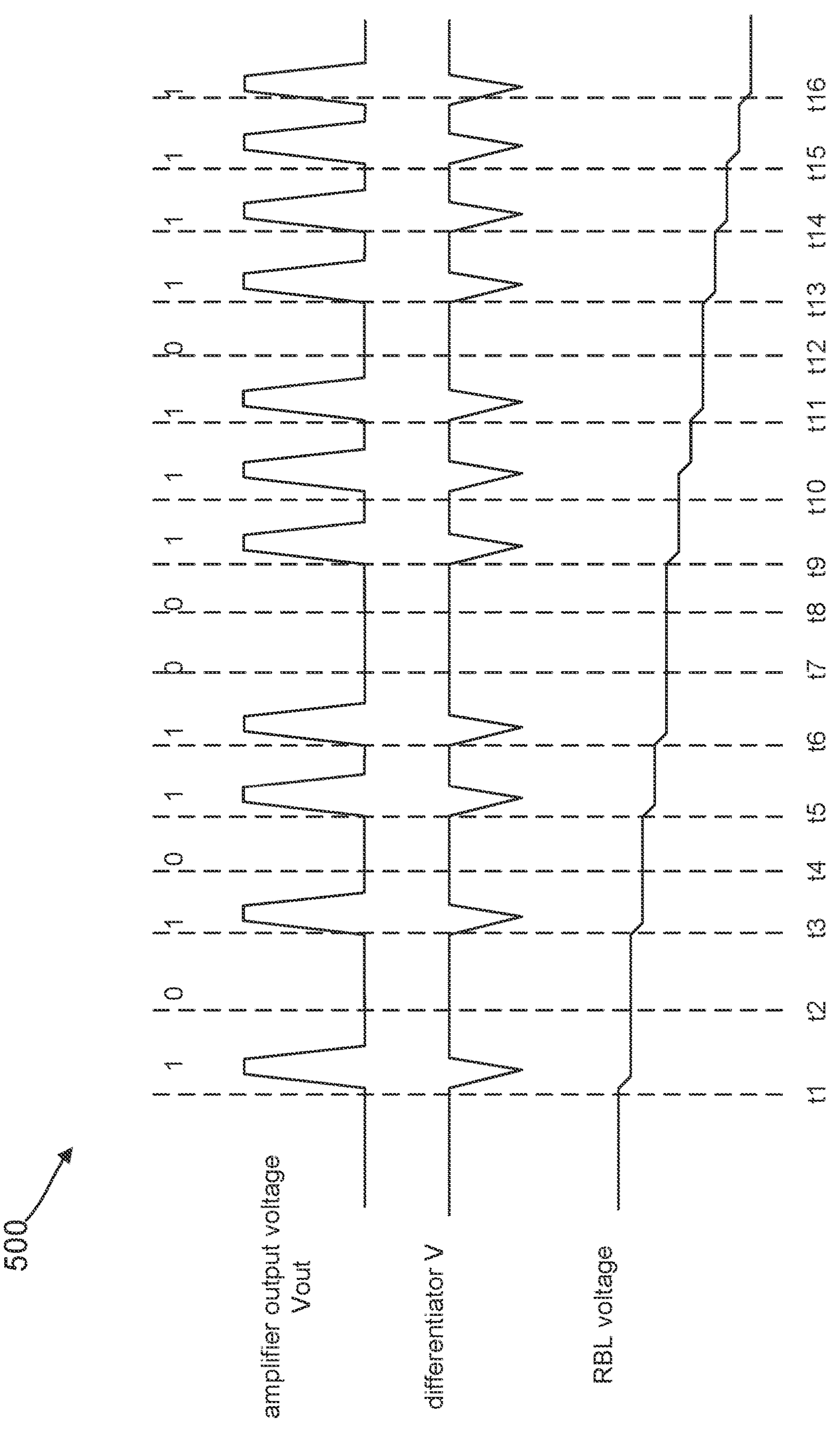
FIG. 5 illustrates some operating waveforms for an implementation of the compute-in-memory system of FIG. 4 in accordance with an aspect of the disclosure.

Some operating waveforms 500 for the current transition detection circuit 401 are shown in FIG. 5. In this implementation, a MAC circuit 425 that drives the read bit line in the compute-in-memory system 400 of FIG. 4 includes sixteen CiM bitcells (not illustrated) and thus has sixteen different read word lines (not illustrated). These sixteen read word lines are then sequentially charged one after another as discussed analogously for the read word line driver 225 depending upon the corresponding activation bits. The sequential excitations of the read word lines are timed starting from an initial read word line excitation at a time t1 to a final read word line excitation at a time t16. Recall that the read bit line current is increased by a given CiM bitcell only if the both the corresponding activation bit and the stored filter weight bit are both binary ones. The result of the binary multiplication of the activation bit and the stored filter weight bit then produces a binary one. If either the activation bit and/or the stored filter weight bit is a binary zero, then the result of the binary multiplication is a binary zero. At the time t1, a time t3, a time t5, a time t9, a time t10, a time t11, a time t13, a time t14, and the time t15, the RBL voltage transitions lower due to the corresponding increase in the read bit line current such that the differentiator voltage V will have a negative pulsing and the amplifier output voltage Vout will have a positive pulsing at these times. Conversely, at a time t2, a time t4, a time t7, a time t8, and a time t12, there is no increase in the read bit line current such that the differentiator voltage V will not change. There is thus no negative pulsing of the differentiator voltage V nor any positive pulsing of the amplifier output voltage Vout at those times.

Figure 6:
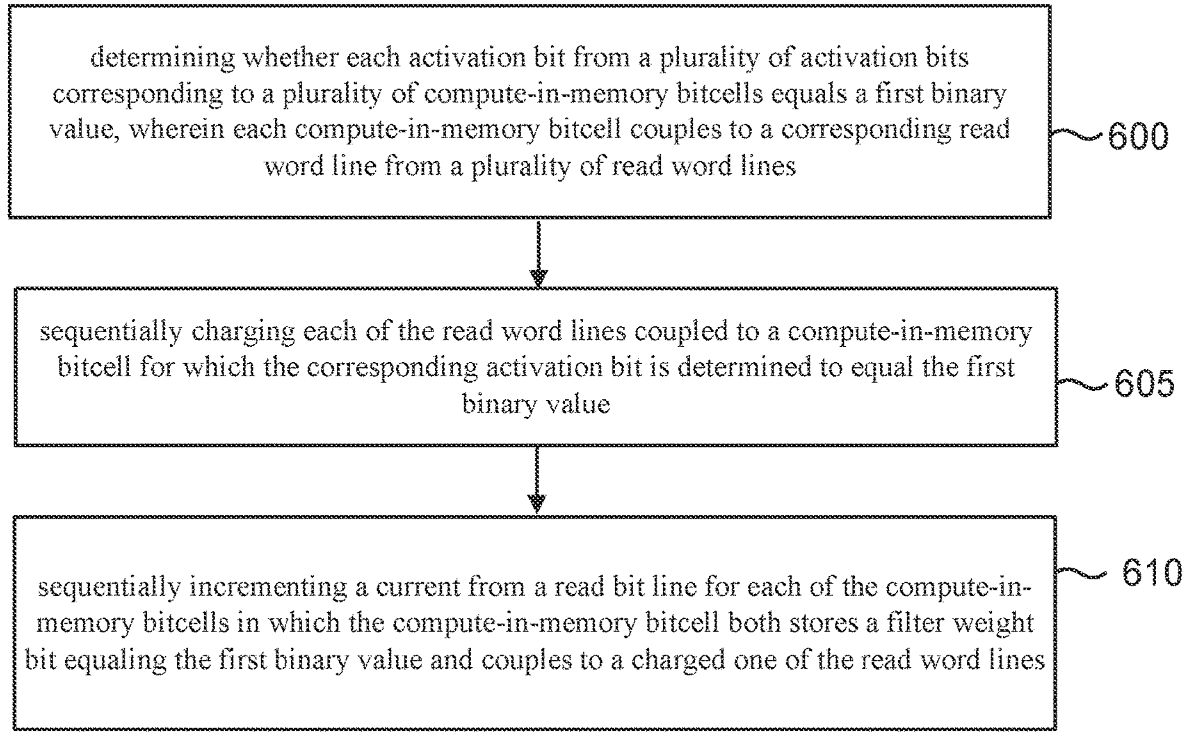
FIG. 6 is a flowchart of an example compute-in-memory method in accordance with an aspect of the disclosure.

An example compute-in-memory operation for a compute-in-memory system will now be discussed with reference to the flowchart of FIG. 6. The method includes an act 600 determining whether each activation bit from a plurality of activation bits corresponding to a plurality of compute-in-memory bitcells equals a first binary value, wherein each compute-in-memory bitcell couples to a corresponding read word line from a plurality of read word lines. The determination by the read word line driver 425 of which of the activation bits equals a binary one is an example of act 600. The method also includes an act 605 of sequentially charging each of the read word lines coupled to a compute-in-memory bitcell for which the corresponding activation bit is determined to equal the first binary value. The sequential charging of the read word lines by the read word line driver 425 is an example of act 605. Finally, the method includes an act 610 of sequentially incrementing a current from a read bit line for each of the compute-in-memory bitcells in which the compute-in-memory bitcell both stores a filter weight bit equaling the first binary value and couples to a charged one of the read word lines. The sequential incrementing of the read bit line current as discussed with respect to FIG. 3 is an example of act 610.

The disclosure will now be summarized in the following example clauses:

Clause 1. A compute-in-memory multiply-and-accumulate circuit, comprising;

a read bit line;

a plurality of read word lines;

a plurality of compute-in-memory bitcells corresponding to the plurality of read word lines, wherein each compute-in-memory bitcell includes a first transistor coupled to the read bit line and having a gate coupled to the corresponding read word line; and a read word line driver configured to receive a plurality of activation bits corresponding to the plurality of read word lines, the read word line driver being further configured to sequentially charge each read word line for which the corresponding activation bit equals a first binary value.

Clause 2. The compute-in-memory multiply-and-accumulate circuit of clause 1, wherein each compute-in-memory bitcell further includes:

a pair of cross-coupled inverters having a bit node and a complement bit node; and a second transistor coupled between ground and the first transistor, wherein the bit node couples to a gate of the first transistor.

Clause 3. The compute-in-memory multiply-and-accumulate circuit of clause 2, wherein each compute-in-memory bitcell further includes:

a first access transistor coupled to the bit node; and a second access transistor coupled to the complement bit node.

Clause 4. The compute-in-memory multiply-and-accumulate circuit of clause 3, further comprising:

a write bit line coupled to each first access transistor; and a complement write bit line coupled to each second access transistor.

Clause 5. The compute-in-memory multiply-and-accumulate circuit of clause 4, further comprising:

a write word line coupled to a gate of each first access transistor and to a gate of each second access transistor.

Clause 6. The compute-in-memory multiply-and-accumulate circuit of any of clauses 1-5, wherein the read word line driver is further configured to sequentially each read word line responsive to cycles of a clock signal.

Clause 7. The compute-in-memory multiply-and-accumulate circuit of any of clauses 1-6, wherein the compute-in-memory multiply-and-accumulate circuit is included within a system comprising:

a differentiator coupled to the read bit line and configured to differentiate a voltage of the read bit line to produce a differentiator voltage.

Clause 8. The compute-in-memory multiply-and-accumulate circuit of clause 7, wherein the system further comprises:

an amplifier configured to amplify the differentiator voltage into an amplifier output voltage; and a counter configured to count pulses of the amplifier output voltage to provide a multiply-and-accumulate result.

Clause 9. The compute-in-memory multiply-and-accumulate circuit of clause 8, wherein the amplifier comprises an inverting amplifier.

Clause 10. The compute-in-memory multiply-and-accumulate circuit of any of clauses 8-9, wherein the differentiator comprises a resistor-capacitor high-pass filter.

Clause 11. A compute-in-memory method, comprising:

determining whether each activation bit from a plurality of activation bits corresponding to a plurality of compute-in-memory bitcells equals a first binary value, wherein each compute-in-memory bitcell couples to a corresponding read word line from a plurality of read word lines;

sequentially charging each of the read word lines coupled to a compute-in-memory bitcell for which the corresponding activation bit is determined to equal the first binary value; and sequentially incrementing a current from a read bit line for each of the compute-in-memory bitcells in which the compute-in-memory bitcell both stores a filter weight bit equaling the first binary value and couples to a charged one of the read word lines.

Clause 12. The compute-in-memory method of clause 11, further comprising:

differentiating a voltage of the read bit line to produce a differentiator voltage that pulses in response to the incrementing of the current from the read bit line.

Clause 13. The compute-in-memory method of clause 12, further comprising:

amplifying the differentiator voltage to produce an amplifier output voltage that pulses in response to the pulses of the differentiator voltage.

Clause 14. The compute-in-memory method of clause 13, further comprising:

counting the pulses of the amplifier output voltage to provide a multiply-and-accumulate result.

Clause 15. The method of any of clauses 13-14, wherein amplifying the differentiator voltage comprises inverting and amplifying the differentiator voltage to produce the amplifier output voltage.

Clause 16. A compute-in-memory system, comprising:

a plurality of compute-in-memory bitcells coupled to a read bit line; and a current transition detection circuit configured to detect and count transitions in a current from the read bit line to provide a multiply-and-accumulate result.

Clause 17. The compute-in-memory system of clause 16, wherein the current transition detection circuit comprises:

a differentiator configure to differentiate a voltage of the read bit line to produce a differentiator voltage.

Clause 18. The compute-in-memory system of clause 17, wherein the current transition detection circuit further comprises:

an amplifier configured to amplify the differentiator voltage to produce an amplifier output voltage; and a counter configured to count pulses of the amplifier output voltage to provide the multiply-and-accumulate result.

Clause 19. The compute-in-memory system of any of clauses 17-18, wherein the differentiator comprises a resistor-capacitor high-pass filter.

Clause 20. The compute-in-memory system of any of clauses 16-19, wherein each compute-in-memory bitcell comprises an eight-transistor compute-in-memory bitcell.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A compute-in-memory multiply-and-accumulate circuit, comprising;

a read bit line;

a plurality of read word lines;

a plurality of compute-in-memory bitcells corresponding to the plurality of read word lines, wherein each of the plurality of compute-in-memory bitcells includes a first transistor coupled to the read bit line and having a gate coupled to the corresponding read word line; and a read word line driver configured to receive a plurality of activation bits corresponding to the plurality of read word lines, the read word line driver being further configured to sequentially charge each read word line for which the corresponding activation bit equals a first binary value, wherein the read bit line provides a sequentially incremented current for the each of the plurality of compute-in-memory bitcells in which the each of the plurality of compute-in-memory bitcells stores a filter weight bit equaling the first binary value and couples to a charged one read word line of the plurality of read word lines.

2. The compute-in-memory multiply-and-accumulate circuit of claim 1, wherein each compute-in-memory bitcell further includes:

a pair of cross-coupled inverters having a bit node and a complement bit node; and a second transistor coupled between ground and the first transistor, wherein the bit node couples to a gate of the first transistor.

3. The compute-in-memory multiply-and-accumulate circuit of claim 2, wherein each compute-in-memory bitcell further includes:

a first access transistor coupled to the bit node; and a second access transistor coupled to the complement bit node.

4. The compute-in-memory multiply-and-accumulate circuit of claim 3, further comprising:

a write bit line coupled to each first access transistor; and a complement write bit line coupled to each second access transistor.

5. The compute-in-memory multiply-and-accumulate circuit of claim 4, further comprising:

a write word line coupled to a gate of each first access transistor and to a gate of each second access transistor.

6. The compute-in-memory multiply-and-accumulate circuit of claim 1, wherein the read word line driver is further configured to sequentially each read word line responsive to cycles of a clock signal.

7. The compute-in-memory multiply-and-accumulate circuit of claim 1, wherein the compute-in-memory multiply-and-accumulate circuit is included within a system comprising:

a differentiator coupled to the read bit line and configured to differentiate a voltage of the read bit line to produce a differentiator voltage.

8. The compute-in-memory multiply-and-accumulate circuit of claim 7, wherein the system further comprises:

an amplifier configured to amplify the differentiator voltage into an amplifier output voltage; and a counter configured to count pulses of the amplifier output voltage to provide a multiply-and-accumulate result.

9. The compute-in-memory multiply-and-accumulate circuit of claim 8, wherein the amplifier comprises an inverting amplifier.

10. The compute-in-memory multiply-and-accumulate circuit of claim 8, wherein the differentiator comprises a resistor-capacitor high-pass filter.

11. A compute-in-memory method, comprising:

determining whether each of a plurality of activation bits corresponding to a plurality of compute-in-memory bitcells equals a first binary value, wherein each of the plurality of compute-in-memory bitcells couples to a corresponding read word line from a plurality of read word lines;

sequentially charging each of the plurality of read word lines coupled to a compute-in-memory bitcell for which the corresponding activation bit is determined to equal the first binary value; and sequentially incrementing a current from a read bit line for the each of the plurality of compute-in-memory bitcells in which the each of the plurality of compute-in-memory bitcells stores a filter weight bit equaling the first binary value and couples to a charged one read word line of the plurality of read word lines.

12. The compute-in-memory method of claim 11, further comprising:

differentiating a voltage of the read bit line to produce a differentiator voltage that pulses in response to the incrementing of the current from the read bit line.

13. The compute-in-memory method of claim 12, further comprising:

amplifying the differentiator voltage to produce an amplifier output voltage that pulses in response to the pulses of the differentiator voltage.

14. The compute-in-memory method of claim 13, further comprising:

counting the pulses of the amplifier output voltage to provide a multiply-and-accumulate result.

15. The method of claim 13, wherein amplifying the differentiator voltage comprises inverting and amplifying the differentiator voltage to produce the amplifier output voltage.

16. A compute-in-memory system, comprising:

a plurality of compute-in-memory bitcells coupled to a read bit line; and a current transition detection circuit configured to detect and count transitions in a current from the read bit line to provide a multiply-and-accumulate result, wherein the read bit line provides a sequentially incremented current for each of the plurality of compute-in-memory bitcells in which the each of the plurality of compute-in-memory bitcells stores a filter weight bit equaling the first binary value and couples to a charged one read word line of a plurality of read word lines.

17. The compute-in-memory system of claim 16, wherein the current transition detection circuit comprises:

a differentiator configure to differentiate a voltage of the read bit line to produce a differentiator voltage.

18. The compute-in-memory system of claim 17, wherein the current transition detection circuit further comprises:

an amplifier configured to amplify the differentiator voltage to produce an amplifier output voltage; and a counter configured to count pulses of the amplifier output voltage to provide the multiply-and-accumulate result.

19. The compute-in-memory system of claim 17, wherein the differentiator comprises a resistor-capacitor high-pass filter.

20. The compute-in-memory system of claim 16, wherein each compute-in-memory bitcell comprises an eight-transistor compute-in-memory bitcell.

* * * * *